(12) United States Patent
Bu et al.

(10) Patent No.: US 7,910,420 B1
(45) Date of Patent: Mar. 22, 2011

(54) SYSTEM AND METHOD FOR IMPROVING CMOS COMPATIBLE NON VOLATILE MEMORY RETENTION RELIABILITY

(75) Inventors: Jiankang Bu, Windham, ME (US); Henry G. Prosack, Jr., Scarborough, ME (US); David Courtney Parker, Topsham, ME (US); Heather McCulloh, Kennebunk, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1183 days.

(21) Appl. No.: 11/486,892

(22) Filed: Jul. 13, 2006

(51) Int. Cl.
*H01L 21/8238* (2006.01)
(52) U.S. Cl. ..................................... 438/199
(58) Field of Classification Search .......... 438/257, 438/199
See application file for complete search history.

(56) References Cited

U.S. PATENT DOCUMENTS

| | | | | |
|---|---|---|---|---|
| 5,256,584 | A * | 10/1993 | Hartmann | 438/257 |
| 6,100,559 | A * | 8/2000 | Park | 257/315 |
| 7,102,232 | B2 * | 9/2006 | Clevenger et al. | 257/751 |
| 2002/0192909 | A1 * | 12/2002 | Weimer | 438/257 |
| 2003/0113962 | A1 * | 6/2003 | Chindalore et al. | 438/201 |
| 2004/0166696 | A1 * | 8/2004 | Lee | 438/792 |
| 2008/0254643 | A1 * | 10/2008 | Clevenger et al. | 438/778 |

OTHER PUBLICATIONS

Degraeve, Robin "Analytical Percolation Model for Predicting Anomalous Charge Loss in Flash Memories" IEEE Transactions on Electron Devices, vol. 51, No. 9 Sep. 2004 pp. 1392-1400.*
Yang et al. ("Yang" Yang, Yang (Larry) "Reliability considerations in scaled SONOS nonvolatile memory devices" Solid-State Electronics 43 (1999) pp. 2025-2032).*
Wofl et al. ("Wolf" Wolf, Stanley "Silicon Processing for the VLSI Era" vol. 1 2nd ed. 2001 pp. 206).*
H. McCulloh, et al., "Reducing FHDP Plasma Induced Damage with Silicon-rich Oxide and Oxynitride Barrier Layers," 2004 IEEE International Conference on Integrated Circuit Design and Technology, pp. 291-294.
Jiankang Bu, et al., "A CMOS Compatible Single Polysilicon Embedded NVM," 2005 IEEE, 2 pages.

* cited by examiner

*Primary Examiner* — N Drew Richards
*Assistant Examiner* — Grant S Withers

(57) ABSTRACT

A system and method is disclosed for improving complementary metal oxide semiconductor (CMOS) compatible non volatile memory (NVM) retention reliability in memory cells. A memory cell of the invention comprises a backend layer that reduces charge leakage from a floating gate of the memory cell. A first bottom portion of the backend layer is formed from a first layer of silicon oxynitride having a low value of defect/trap density. A second top portion of the backend layer is formed from a second layer of silicon oxynitride having a high value of defect/trap density. The first layer of silicon oxynitride inhibits electron transport and the second layer of silicon oxynitride protects CMOS devices from plasma induced damage.

21 Claims, 4 Drawing Sheets

AMPHOTERIC TRAP MODEL

US 7,910,420 B1

SYSTEM AND METHOD FOR IMPROVING CMOS COMPATIBLE NON VOLATILE MEMORY RETENTION RELIABILITY

TECHNICAL FIELD OF THE INVENTION

The present invention is generally directed to the manufacture of integrated circuits and, in particular, to a system and method for providing an improvement in CMOS compatible non volatile memory retention reliability.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

It is well known that CMOS compatible non volatile memory (NVM) devices often experience additional charge leakage through backend dielectric layers. The charge leakage through backend dielectric layers is in addition to the charge leakage that NVM devices experience through the front end gate oxide layer in stacked gate NVM devices.

FIG. 1 illustrates a schematic cross sectional diagram of an exemplary prior art non volatile memory (NVM) cell 100. Memory cell 100 comprises a polysilicon gate 110 (designated "POLY GATE 110" in FIG. 1). Polysilicon gate 110 and other elements of the memory cell 100 are covered with backend dielectric 120. In this example backend dielectric 120 is made of tetraethyloxysilane (TEOS). Therefore, backend dielectric 120 is designated as "TEOS 120" in FIG. 1.

Backend dielectric TEOS 120 is covered with backend dielectric 130. In this example backend dielectric 130 is made of silicon oxynitride (SiON). Therefore, backend dielectric 130 is designated "SiON 130" in FIG. 1. Lastly, backend dielectric 130 is covered with backend dielectric 140. In this example backend dielectric 140 is made of plasma enhanced chemical vapor deposition (PECVD) oxide. Therefore, backend dielectric 140 is designated "PECVC oxide 140" in FIG. 1.

The fabrication process for a single poly NVM device is compatible with CMOS devices. The polysilicon gate in an NVM device is a floating gate (FG) that store electrons. The backend dielectric layers (TEOS 120, SiON 130, PECVD oxide 140) have a higher density of defects/traps than a front end gate oxide layer. The higher density of defects/traps enhances the Trap-Assisted-Tunneling (TAT) of electrons in the oxide layers. The higher density of defects/traps enhances thermal excitation in the silicon oxynitride (SiON) layer.

In a CMOS process the silicon oxynitride (SiON) layer is designed to be leaky (i.e., to have more defects/traps) in order to prevent plasma induced damage. Electrons stored on the polysilicon floating gate 110 may tunnel through the TEOS layer 120 to arrive at the leaky silicon oxynitride layer 130 (SiON 130). From the SiON layer 130 the electrons can easily move to the substrate layer (not shown in FIG. 1). This results in a higher charge decay rate for electrons that are stored on the floating gate. This also results in retention degradation especially at higher temperatures.

FIG. 2 illustrates an energy band diagram 200 for the electron charge decay mechanism (i.e., backend charge leakage). The electrons (designated e– in FIG. 2) are initially located on the polysilicon floating gate (FG) 110. The electrons can leak out of the floating gate (FG) 110 through the TEOS dielectric layer 120 through Trap-Assisted-Tunneling (TAT). This is shown in FIG. 2 by an electron entering one of the traps in the TEOS layer 120. The electrons then pass into the silicon oxynitride (SiON) layer 130. As shown in FIG. 1 and in FIG. 2 the electrons move through the silicon oxynitride (SiON) layer 130 to the substrate (not shown in FIG. 1).

This backend charge leakage is a serious problem for CMOS compatible NVM devices. Several different methods have been explored to reduce the leakage of charge from the backend dielectric layers in order to improve CMOS compatible retention performance.

A first approach has been to add a mask to the silicon oxynitride (SiON) layer 130 to etch the silicon oxynitride (SiON) layer 130 away from the top of the floating gate (FG) 110. The mask allows the SiON layer 130 to be selectively etched from the top of the NVM devices. The SiON layer 130 is left on top of the CMOS devices. The absence of SiON layer 130 over the top of the floating gate (FG) 110 breaks the charge leakage path. Electrons on the floating gate (FG) 110 therefore have a much slower decay rate by tunneling in oxide instead of going through a relatively leaky SiON layer 130 that is connected to the substrate.

A second approach has been to increase the thickness of the TEOS layer 120. This increases the tunneling distance from the floating gate (FG) 110 to the SiON layer 130. This causes the electrons to take a longer time to arrive at the relatively leaky SiON layer 130.

A third approach has been to modulate the density of the defects/traps in the SiON layer 120 in order to make the SiON layer 120 highly non-conductive. The fewer defects/traps there are in the SiON layer 120, the less conductivity there is in the SiON layer 120. Electrons that arrive at the SiON layer 120 will have difficulty in traveling to other locations. The electrons that collect in the SiON layer 120 will deter further leakage of electrons from the floating gate (FG) 110.

CMOS compatible NVM performance is not as good as other mainstream NVM technology (e.g., stacked gate NVM, split gate NVM, SONOS (silicon-oxide-nitride-oxide-silicon) NVM). CMOS compatible NVM performance has slow speed, low density and limited endurance. But it has one major advantage. It has low cost because its fabrication process is compatible with CMOS processes. CMOS compatible NVM technology is advantageous in some applications where limited speed, density and endurance NVM technology is needed but the cost would be too high if mainstream NVM technology were employed. Therefore, the low cost feature is critical to CMOS compatible NVM technology.

The three approaches mentioned above for improving CMOS compatible NVM retention performance have significant drawbacks. The first approach requires the addition of a mask and etch step to the standard CMOS process. This increases the cost. More importantly, when etching the SiON layer 130 from the top of the floating gate (FG) 110, limited etch selectivity between the SiON layer 130 and the TEOS layer 120 always leads to some over-etch of the TEOS layer 120. A thinner TEOS layer 120 will lead to an increased level of electron discharge from the floating gate (FG) 110. In addition, etching away the SiON layer 130 will expose the floating gate (FG) 110 and the TEOS layer 120 to backend plasma damage. This will lead to a degradation of the NVM device retention.

The second approach requires an increase in the thickness of the TEOS layer 120. In order to get a satisfactory retention performance the TEOS layer 120 needs to have at least a double thickness. The creation of a thicker TEOS layer 120 alters the CMOS process and significantly alters the device parameters. After this step the NVM device is no longer CMOS compatible.

The third approach results in plasma induced damage. The CMOS process requires that the SiON layer 130 be leaky so that charges from the plasma process have a leakage path.

Therefore, there is a need in the art for a system and a method that can (1) reduce charge leakage from the floating gate, and (2) not result in plasma induced damage, and (3) not significantly change CMOS device parameters. There is a need in the art for a system and a method that can balance the NVM retention requirements and the CMOS device requirements. There is a need in the art for a system and a method that can fabricate NVM devices and CMOS devices in the same manufacturing process.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
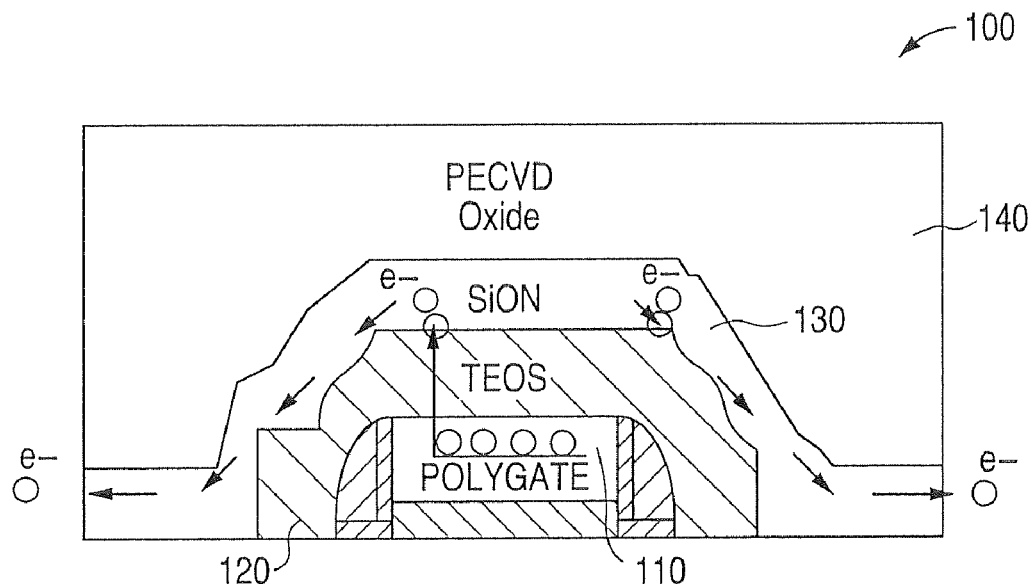
FIG. 1 illustrates a schematic cross sectional diagram of an exemplary prior art non volatile memory (NVM) cell.
Figure 2:
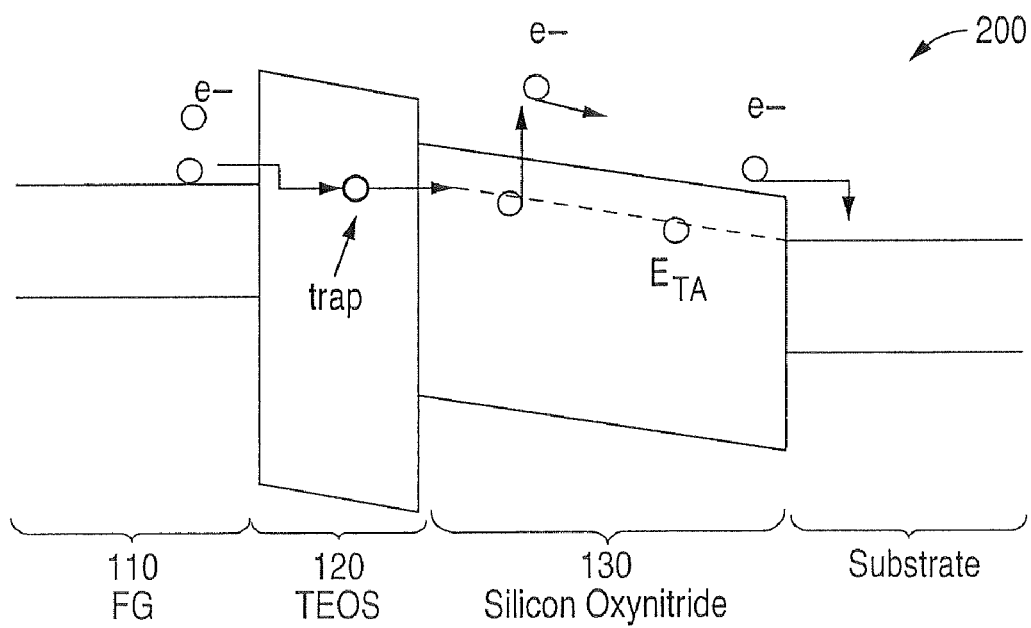
FIG. 2 illustrates an energy band diagram for an electron charge decay mechanism from a floating gate of the prior art non volatile memory (NVM) cell shown in FIG. 1.

FIGS. 3 through 8, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged non volatile memory (NVM) technology.

The present invention comprises an improved non volatile memory (NVM) cell. The non volatile memory (NVM) cell of the present invention comprises a second silicon oxynitride (SiON) layer on top of a first silicon oxynitride (SiON) layer. The first and second SiON layers are located over a TEOS layer and the TEOS layer is located over the floating gate (FG) of the memory cell.

The second SiON layer (i.e., the top SiON layer) has a higher defect/trap density than does the first SiON layer (i.e., the bottom SiON layer). In an advantageous embodiment of the invention the combined thickness of the first SiON layer and the second SiON layer equals the thickness of a prior art SiON layer (e.g., SiON layer 130 in memory cell 100).

The first (bottom) SiON layer inhibits electron transport (with its relatively low defect/trap density) and improves NVM retention. The second (top) SiON layer (with its relatively high defect/trap density) protects the CMOS devices from plasma induced damage. The non volatile memory (NVM) cell of the present invention improves CMOS compatible NVM retention with a minimum alteration of the CMOS device manufacturing process.

The method of the present invention creates a double SiON layer by forming the first (bottom) SiON layer over the TEOS layer and then forming the second (top) SiON layer over the first (bottom) SiON layer. The first (bottom) SiON layer is fabricated using a low silane ($SiH_4$) to ammonia ($NH_3$) gas flow ratio. Typically a one to sixteen ratio is used. That is, the gas flow comprises one part silane ($SiH_4$) to sixteen parts ammonia ($NH_3$) to fabricate the first (bottom) SiON layer.

The second (top) SiON layer is fabricated using a high silane ($SiH_4$) to ammonia ($NH_3$) gas flow ratio. Typically a one to three ratio is used. That is, the gas flow comprises one part silane ($SiH_4$) to three parts ammonia ($NH_3$) to fabricate the second (top) SiON layer. In an advantageous embodiment of the invention the double SiON layer is fabricated in one process step by controlling the gas flow ratio for the two different SiON layers at different times.

In an alternate embodiment of the invention, the SiON layer is fabricated by depositing a single SiON layer that has a defect/trap density gradient. The defect/trap density gradient extends from the bottom of the SiON layer (where there is a relatively low defect/trap density) to the top of the SiON layer (where there is a relatively high defect/trap density). In this advantageous embodiment there is one SiON layer with a defect/trap density gradient instead of two SiON layers each with a different defect/trap density value.

In a standard CMOS process the silicon oxynitride (SiON) is fabricated by a chemical vapor deposition (CVD) process. The basic chemical reaction is as follows:

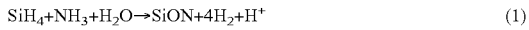

$$SiH_4 + NH_3 + H_2O \rightarrow SiON + 4H_2 + H^+ \quad (1)$$

Silicon atoms create dangling bonds in SiON film. Hydrogen atoms terminate the dangling bonds by forming silicon-hydrogen (Si—H) bonds. The ratio of the silane ($SiH_4$) to ammonia ($NH_3$) in the gas flow determines the defect/trap density in the silicon oxynitride (SiON) film.

Figure 3:
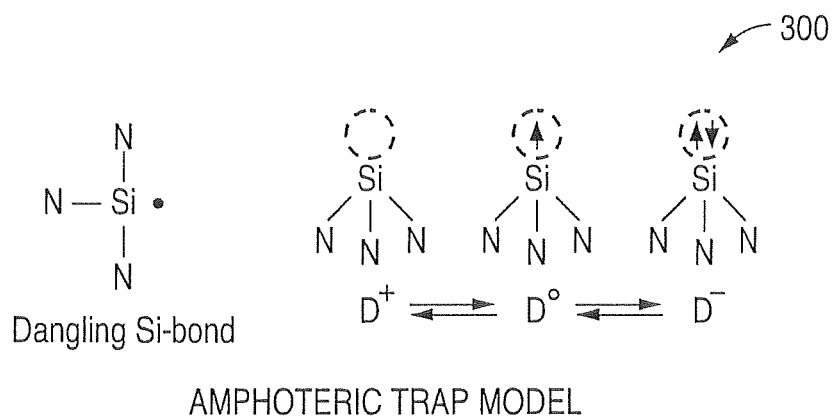
FIG. 3 illustrates an amphoteric trap model that shows the chemical structure of a dangling silicon (Si) bond in a nitride film.

FIG. 3 illustrates a physical model (referred to as an "amphoteric trap model") that shows the chemical structure of a dangling silicon (Si) bond in a nitride film. As shown in FIG. 3, each silicon (Si) atom has a valence of four. Each of three of the four valence bonds is connected to a nitrogen (N) atom. If the fourth valence bond is unoccupied it is referred to as a "dangling" silicon (Si) bond. This state is shown in FIG. 3 with the designation D.

In a standard CMOS process a one to six (1:6) gas flow ratio is typically used for the silane ($SiH_4$) to ammonia ($NH_3$) to create a silicon oxynitride (SiON) film above the polysilicon gate and TEOS dielectric layer. For flash memories built on CMOS processes a silicon oxynitride (SiON) film with a one to sixteen (1:16) gas flow ratio for the silane ($SiH_4$) to ammonia ($NH_3$) has been developed for interpoly isolation because of its relatively low defect/trap density. In addition, a silicon oxynitride (SiON) film with a one to three (1:3) gas flow ratio for the silane ($SiH_4$) to ammonia ($NH_3$) has been developed for charge storage purposes because of its relatively high defect/trap density.

Figure 4A:
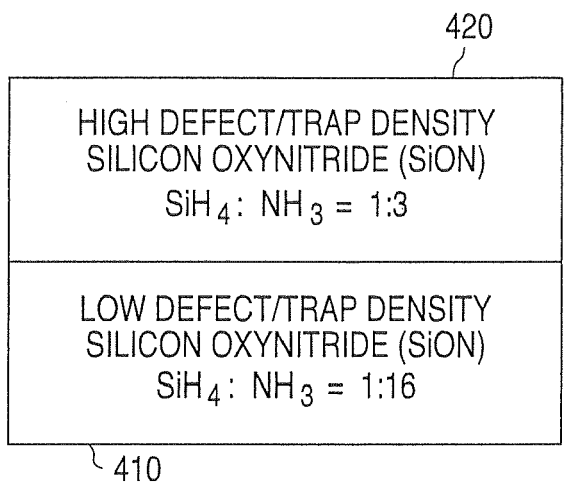
FIG. 4A illustrates a first advantageous embodiment of the present invention in which a silicon oxynitride (SiON) layer comprises two separate layers each having a different value of a defect/trap density.

FIG. 4A illustrates an advantageous embodiment of the present invention in which a silicon oxynitride (SiON) layer is deposited in two steps. In the first step of forming the SiON layer, a low defect/trap density SiON layer 410 is deposited. This is accomplished by setting the silane ($SiH_4$) to ammonia ($NH_3$) gas flow ratio to one to sixteen (1:16) during the first half of the SiON fabrication process. Low defect/trap density SiON layer 410 has a correspondingly low conductivity. The low defect/trap density inhibits electron transport in the SiON layer 410 and inhibits the ultimate leakage of the electrons to the substrate (not shown). If electrons from the floating gage (FG) tunnel through the TEOS layer and enter the SiON layer the electrons will first encounter the low conductivity SiON layer 410.

In the second step of forming the SiON layer, a high defect/trap density SiON layer 420 is deposited over the low defect/trap density SiON layer 410. This is accomplished by setting the silane ($SiH_4$) to ammonia ($NH_3$) gas flow ratio to one to three (1:3) during the second half of the SiON fabrication process. The high defect/trap density SiON layer 420 has a correspondingly high conductivity. The high defect/trap density of SiON layer 430 effectively protects the CMOS devices from plasma induced damage.

In one advantageous embodiment the thickness of the low density/trap SiON layer 410 and the thickness of the high density/trap SiON layer 420 are each equal to one half of the thickness of a prior art SiON layer (e.g., SiON layer 130 of prior art memory cell 100). In this embodiment the combined thickness of the SiON layer 410 and the SiON layer 420 equals the thickness of a prior art SiON layer.

The second SiON layer 420 is intentionally deposited with a higher gas flow ratio (e.g., one to three (1:3)) than the gas flow ratio normally used in CMOS processes (e.g., one to six (1:6). This is for the consideration of other roles that the silicon oxynitride (SiON) films play in CMOS processes that are related to SiON film properties (e.g., refractive index, ultraviolet (UV) absorption coefficient, permittivity). The combined effect of the bottom SiON layer 410 and the top SiON layer 420 is similar to an original single layer prior art SiON layer in terms of such film properties.

Figure 4B:
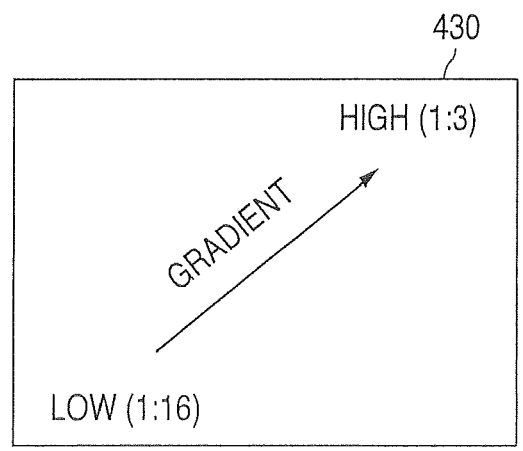
FIG. 4B illustrates a second advantageous embodiment of the present invention in which a silicon oxynitride (SiON) layer comprises one layer having a defect/trap density gradient.

FIG. 4B illustrates another advantageous embodiment of the present invention in which a single SiON layer 430 is deposited. SiON layer 430 is deposited so that the value of the defect/trap density continuously increases from a relatively low value at the bottom of the SiON layer 430 to a relatively high value at the top of the SiON layer 430. That is, the defect/trap density has a gradient that extends from the bottom to the top of the SiON layer 430. In this advantageous embodiment there is one SiON layer 430 with a defect/trap density gradient instead of two SiON layers (410, 420) each with a different defect/trap density value. To create the SiON layer 430 the ratio of the silane ($SiH_4$) to ammonia ($NH_3$) gas flow is continuously increased from one to sixteen (1:16) at the bottom of SiON layer 430 to one to three (1:3) at the top of SiON layer 430 during the deposition process.

The fabrication of the SiON layer 410 and the SiON layer 420 can be accomplished in one fabrication step by controlling the gas flow ratio at different times. The fabrication of the SiON layer 430 can be accomplished in one fabrication step by continuously changing the gas flow ratio during the deposition time interval.

Figure 5:
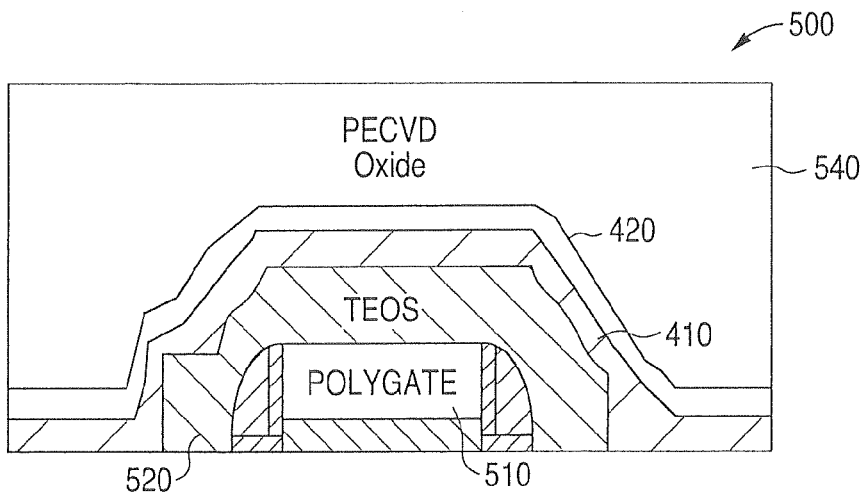
FIG. 5 illustrates a schematic cross sectional diagram of an advantageous embodiment of a non volatile memory (NVM) cell of the present invention.

FIG. 5 illustrates a schematic cross sectional diagram of an advantageous embodiment of a non volatile memory (NVM) cell 500 of the present invention. As shown in FIG. 5, memory cell 500 comprises a polysilicon gate 510 (designated "POLY GATE 510" in FIG. 5). Polysilicon gate 510 and other elements of the memory cell 500 are covered with backend dielectric 520. In this example backend dielectric 520 is made of tetraethyloxysilane (TEOS). Therefore, backend dielectric 520 is designated as "TEOS 520" in FIG. 5.

Backend dielectric TEOS 520 is covered with a first silicon oxynitride (SiON) layer 410. First silicon oxynitride (SiON) layer 410 is designated "SiON 410" in FIG. 5. As previously described, SiON layer 410 has a low defect/trap density. First SiON layer 410 is covered with a second silicon oxynitride (SiON) layer 420. Second silicon oxynitride (SiON) layer 420 is designated "SiON 420" in FIG. 5. As previously described, SiON layer 420 has a high defect/trap density.

Lastly, SiON layer 420 is covered with backend dielectric 540. In this example backend dielectric 540 is made of plasma enhanced chemical vapor deposition (PECVD) oxide. Therefore, backend dielectric 540 is designated "PECVC oxide 540" in FIG. 5.

The non volatile memory (NVM) cell 500 of the present invention has good NVM retention. In addition NVM cell 500 can be fabricated together with standard CMOS devices without additional cost.

One of the design goals in CMOS compatible NVM technology is to improve the NVM retention reliability without negatively impacting CMOS device performance and without increasing the costs. The approach of the present invention circumvents this problem by modulating the SiON defect/trap density at different physical locations. Because the present invention does not need to etch the SiON layer the present invention completely avoids the problem of over-etching the underlying TEOS layer.

Experimental tests of the non volatile memory (NVM) cell 500 of the present invention have been performed. The performance of the NVM cell 500 was compared with the performance of a prior art memory cell 100. It was found that the silicon rich silicon oxynitride (SiON) layer 420 helps protect the CMOS devices from plasma induced damage.

Figure 6:
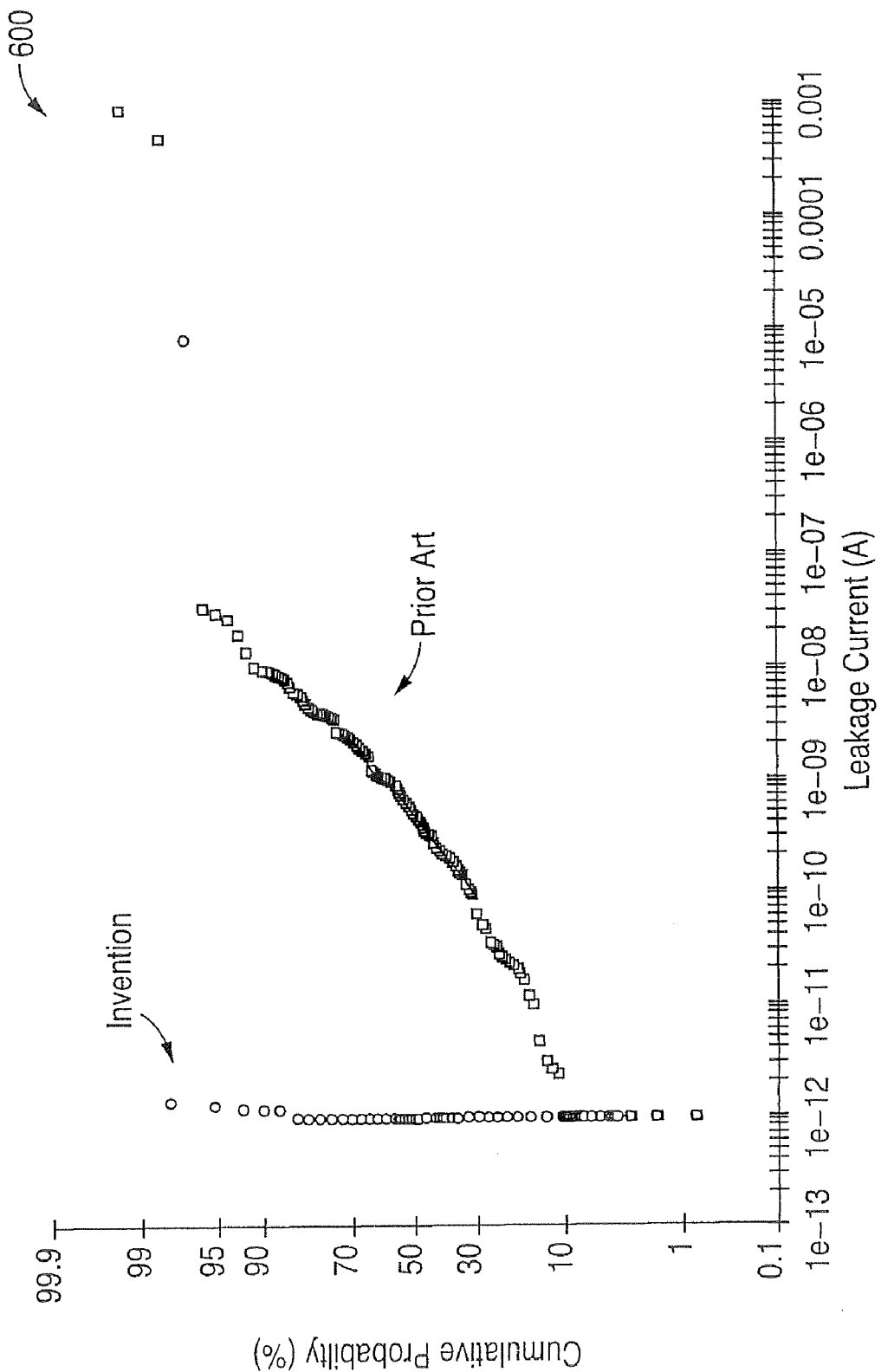
FIG. 6 illustrates a graph that shows metal antenna gate oxide leakage for non volatile memory cells with a standard silicon oxynitride (SiON) dielectric and for non volatile memory cells of the present invention that have a silicon rich silicon oxynitride (SiON) dielectric.

FIG. 6 illustrates a graph 600 that shows metal antenna gate oxide leakage for prior art non volatile memory cells with a standard silicon oxynitride (SiON) layer. Graph 600 also shows metal antenna gate oxide leakage for non volatile memory cells of the present invention that have a silicon rich silicon oxynitride (SiON) layer 420. The abscissa of graph 600 illustrates the leakage current in amperes. The ordinate of graph 600 illustrates the cumulative probability.

As shown in graph 600, the leakage current for the non volatile memory cells of the present invention in on the order of $10^{-12}$ amperes. The leakage current for the prior art non volatile memory cells with a standard silicon oxynitride (SiON) layer is significantly larger than the leakage current for the non volatile memory cells of the present invention.

The silicon rich silicon oxynitride (SiON) layer 420 of the present invention has a higher defect/trap density and higher conductivity. The silicon rich silicon oxynitride (SiON) layer 420 provides an alternate conductive path for plasma induced charge. The alternate conductive path is illustrated in FIG. 7.

Figure 7:
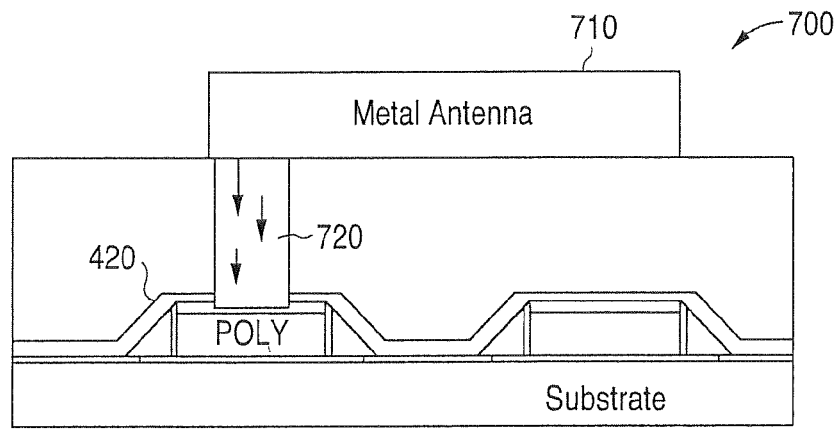
FIG. 7 illustrates a non volatile memory cell showing that silicon rich silicon oxynitride (SiON) can reduce plasma induced damage by proving an alternate conductive path for plasma induced charge.
Figure 8:
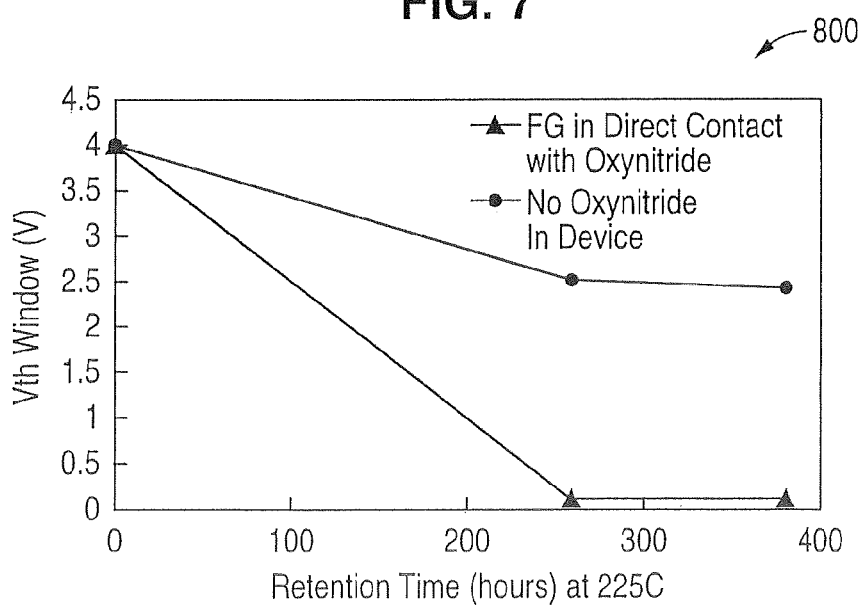
FIG. 8 illustrates a graph that shows retention times for non volatile memory cells with and without a silicon oxynitride (SiON) dielectric.

FIG. 7 illustrates a non volatile memory cell 700 showing that silicon rich silicon oxynitride (SiON) layer 420 can reduce plasma induced damage by proving an alternate conductive path for plasma induced charge. Charge flows from metal antenna 710 through conductor 720. Conductor 720 is connected to the SiON layer 420. The charges in conductor 720 enter the SiON layer 420 and flow laterally through the SiON layer 420.

An experiment was also conducted to determine the effect of silicon oxynitride (SiON) on non volatile memory retention. The results of the experiment are shown in graph 800 in FIG. 8. Graph 800 shows retention times for non volatile memory cells with and without a silicon oxynitride (SiON) layer.

If the TEOS layer is not deposited, then the SiON layer will be in direct contact with the floating gate of the NVM device. The experiment showed that in this case the NVM device will lose all the charge stored on the floating gate in two hundred sixty (260) hours at a temperature of two hundred twenty five degrees Centigrade (225° C.) (when the threshold voltage window (Vth) drops to zero).

But if the TEOS layer is deposited and the SiON layer is not deposited during the fabrication of the NVM device, then the retention at the temperature of two hundred twenty five degrees Centigrade (225° C.) is much better. Although leaving out the SiON layer improves NVM retention it is unacceptable to leave out the SiON layer because the absence of the SiON layer exposes the CMOS devices to plasma damage.

These experimental results indicate that the system and method of the present invention is capable of improving non volatile memory (NVM) retention reliability without having an adverse effect on CMOS devices. The system and method of the present invention allows NVM devices and CMOS devices to be fabricated in the same process. With the present invention there is no additional cost when NVM devices are embedded in a CMOS process.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for reducing charge leakage through a layer formed on top of a polysilicon gate of a memory cell, said method comprising the steps of:
   forming a bottom portion of said layer of said memory cell from a first layer of silicon oxynitride; and
   forming a top portion of said layer of said memory cell from a second layer of silicon oxynitride;
   wherein the second layer of silicon oxynitride has a higher defect/trap density than does the first layer of silicon oxynitride.

2. The method as set forth in claim 1 wherein said first layer of silicon oxynitride inhibits electron transport through the first layer of silicon oxynitride.

3. The method as set forth in claim 1 wherein said second layer of silicon oxynitride provides protection from plasma induced damage.

4. The method as set forth in claim 1 wherein said step of forming said bottom portion of said layer comprises:
   forming a defect/trap density in said first layer of silicon oxynitride using a silane to ammonia gas flow comprising approximately one part silane to approximately sixteen parts ammonia.

5. The method as set forth in claim 1 wherein said step of forming said top portion of said layer comprises:
   forming a defect/trap density in said second layer of silicon oxynitride using a silane to ammonia gas flow comprising approximately one part silane to approximately three parts ammonia.

6. A method for improving complementary metal oxide semiconductor (CMOS) compatible non-volatile memory retention reliability in a memory cell, said method comprising the step of:
   forming a layer on top of a polysilicon gate of said memory cell, wherein the layer has a bottom portion comprising a first layer of silicon oxynitride and a top portion comprising a second layer of silicon oxynitride;
   wherein the second layer of silicon oxynitride has a higher defect/trap density than does the first layer of silicon oxynitride.

7. The method as set forth in claim 6 wherein said first layer of silicon oxynitride inhibits electron transport through the first layer of silicon oxynitride and wherein said second layer of silicon oxynitride protects CMOS devices from plasma induced damage.

8. The method as set forth in claim 6 wherein said formation of said backend layer for said memory cell does not change CMOS device parameters.

9. The method as set forth in claim 6 wherein:
   said first layer of silicon oxynitride has a defect/trap density formed by using a low silane to ammonia gas flow of approximately one part silane to approximately sixteen parts ammonia; and
   said second layer of silicon oxynitride has a defect/trap density formed by using a high silane to ammonia gas flow of approximately one part silane to approximately three parts ammonia.

10. The method as set forth in claim 6 wherein the first layer of silicon oxynitride has a defect/trap density gradient that extends from a first defect/trap density at a bottom of the first layer of silicon oxynitride to a second defect/trap density at a top of the first layer of silicon oxynitride;

wherein the second defect/trap density is higher than the first defect/trap density.

11. The method as set forth in claim 10 wherein the second layer of silicon oxynitride has a defect/trap density gradient that extends from a third defect/trap density at a bottom of the second layer of silicon oxynitride to a fourth defect/trap density at a top of the second layer of silicon oxynitride;
wherein the fourth defect/trap density is higher than the third defect/trap density.

12. A method for reducing charge leakage through a layer formed on top of a polysilicon gate of a memory cell, the method comprising the steps of:
forming a portion of the layer of the memory cell from a layer of silicon oxynitride, the layer of silicon oxynitride having a defect/trap density gradient that extends from a bottom of the layer of silicon oxynitride to a top of the layer of silicon oxynitride;
wherein the defect trap density gradient has a first defect/trap density at the bottom of the layer of silicon oxynitride and a second defect/trap density at the top of the layer of silicon oxynitride; and
wherein the second defect/trap density is higher than the first defect/trap density.

13. The method as set forth in claim 12 wherein the defect/trap density gradient is formed by continuously changing a gas flow ratio of silane to ammonia during a time interval in which the layer of silicon oxynitride is deposited.

14. The method as set forth in claim 12 wherein the layer of silicon oxynitride inhibits electron transport through the layer of silicon oxynitride.

15. The method as set forth in claim 12 wherein forming the portion of the backend layer does not change CMOS device parameters.

16. The method as set forth in claim 12 wherein the defect/trap density gradient is formed by using a silane to ammonia gas flow ranging from (i) approximately one part silane to approximately sixteen parts ammonia to (ii) approximately one part silane to approximately three parts ammonia.

17. A method for reducing charge leakage through a layer formed on top of a polysilicon gate of a memory cell, the method comprising the steps of:
depositing a first layer of silicon oxynitride to form a first portion of the layer of the memory cell; and
depositing a second layer of silicon oxynitride to form a second portion of the layer of the memory cell;
wherein the second layer of silicon oxynitride has a higher defect/trap density than does the first layer of silicon oxynitride.

18. The method as set forth in claim 17 wherein the first layer of silicon oxynitride inhibits electron transport through the first layer of silicon oxynitride.

19. The method as set forth in claim 17 wherein the second layer of silicon oxynitride provides protection from plasma induced damage.

20. The method as set forth in claim 17 wherein the first layer of silicon oxynitride is deposited using a silane to ammonia gas flow comprising approximately one part silane to approximately sixteen parts ammonia.

21. The method as set forth in claim 17 wherein the second layer of silicon oxynitride is deposited using a silane to ammonia gas flow comprising approximately one part silane to approximately three parts ammonia.

* * * * *